(12) United States Patent
Muraoka et al.

(10) Patent No.: US 6,680,873 B2
(45) Date of Patent: Jan. 20, 2004

(54) SEMICONDUCTOR DEVICE HAVING ELECTRIC FUSE ELEMENT

(75) Inventors: Kazuyoshi Muraoka, Yokohama (JP); Eiji Kozuka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 164 days.

(21) Appl. No.: 10/042,937

(22) Filed: Jan. 8, 2002

(65) Prior Publication Data

US 2002/0093867 A1 Jul. 18, 2002

(30) Foreign Application Priority Data

Jan. 12, 2001 (JP) ........................................ 2001-005561

(51) Int. Cl.[7] ................................................. G11C 8/00
(52) U.S. Cl. .............................. 365/225.7; 365/189.05; 327/525; 327/526
(58) Field of Search ........................ 365/225.7, 189.05, 365/96; 327/525, 526

(56) References Cited

U.S. PATENT DOCUMENTS

| 6,128,241 A | * | 10/2000 | Choi ........................ 365/225.7 |
| 6,201,432 B1 | * | 3/2001 | Lim et al. .................... 327/525 |
| 6,545,926 B2 | * | 4/2003 | Ooishi et al. ............. 365/225.7 |

FOREIGN PATENT DOCUMENTS

JP  2000-132992  5/2000

* cited by examiner

*Primary Examiner*—Richard Elms
*Assistant Examiner*—Nam Nguyen
(74) *Attorney, Agent, or Firm*—Hogan & Hartson, LLP (57) ABSTRACT

The output terminal of a voltage generation circuit is connected to one end portion of a fuse circuit. A transistor is connected to the other end portion of the fuse circuit. In program mode, a voltage generated from the voltage generation circuit is applied to the fuse circuit and a current flows through the fuse circuit and the transistor. In verify mode, a current generated from the voltage generation circuit flows into a pad through a selected fuse circuit and a detection circuit.

18 Claims, 8 Drawing Sheets

SEMICONDUCTOR DEVICE HAVING ELECTRIC FUSE ELEMENT

CROSS-REFERENCE TO RELATED APPLICATIONS

This application is based upon and claims the benefit of priority from the prior Japanese Patent Application No. 2001-005561, filed Jan. 12, 2001, the entire contents of which are incorporated herein by reference.

BACKGROUND OF THE INVENTION

1. Field of the Invention

The present invention relates to, for example, a semiconductor device and more specifically to an electric fuse circuit that is used for setting an operation of the semiconductor device, setting an address of a redundancy circuit, and the like.

2. Description of the Related Art

A fuse circuit is used for setting an operation of a semiconductor device, an address of a redundancy circuit, and the like. A laser fuse that is blown by a laser beam has been used as the fuse circuit; however, its programming is complicated. When a defective memory cell is detected in a process of testing a semiconductor device, it cannot be replaced with a spare cell at once. After the testing, a wafer is carried to another device and in this device a fuse is blown by a laser beam, thereby replacing the defective memory cell with a spare cell. Thus, it takes time to program the laser fuse.

An electrically programmable electric fuse that is easily programmed is developed.

Figure 11:
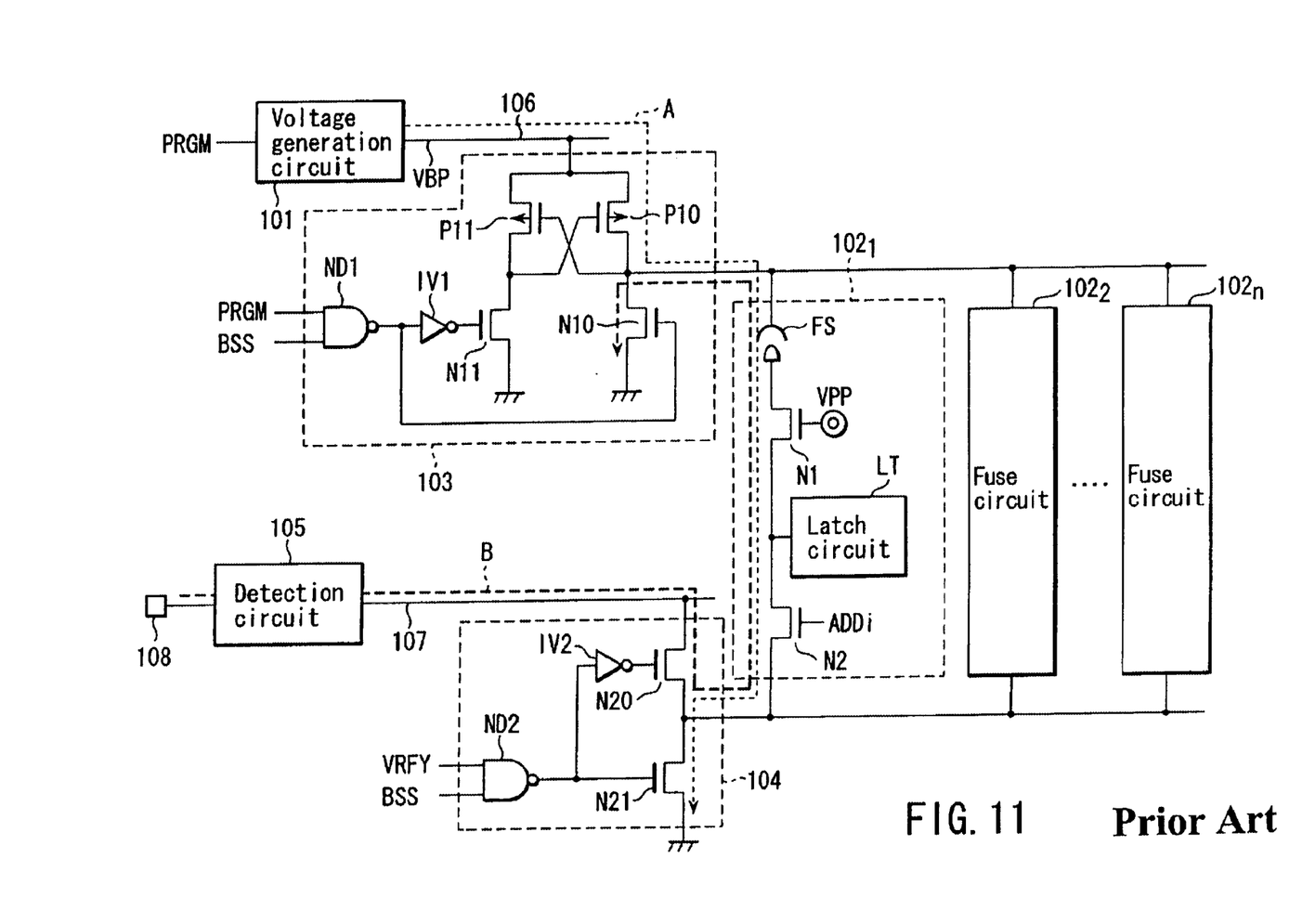
FIG. 11 is a block diagram showing one example of a general semiconductor device.

FIG. 11 shows an example of a general electric fuse circuit.

The electric fuse circuit comprises a voltage generation circuit 101, a plurality of fuse circuits 102$_1$ and 102$_2$ to 102$_n$, a first switch circuit 103, a second switch circuit 104, a detection circuit 105, a first common wire 106, a second common wire 107, and a pad 108. The fuse circuits 102$_1$ and 102$_2$ to 102$_n$ and the first and second switch circuits 103 and 104 are provided for each bank of a semiconductor device and used for setting an address of a redundancy circuit.

The voltage generation circuit 101 generates a high voltage VBP of about 9V in response to a program signal PRGM when a fuse element is programmed. The circuit 101 is connected to the first switch circuit 103 through the first common wire 106.

The first switch circuit 103 includes N-channel MOS transistors N10 and N11, P-channel MOS transistors P10 and P11, a NAND circuit ND1, and an inverter circuit IV1 supplied with an output signal of the NAND circuit ND1. The input terminal of the NAND circuit ND1 is supplied with the program signal PRGM and bank select signal BSS. A connection node between the transistors P10 and N10 of the first switch circuit 103 is connected to one end portion of each of the fuse circuits 102$_1$ and 102$_2$ to 102$_n$.

The fuse circuits 102$_2$ to 102$_n$ each have the same arrangement as that of the fuse circuit 102$_1$. The fuse circuit 102$_1$ includes a fuse element FS, N-channel MOS transistors N1 and N2, and a latch circuit LT. The fuse element FS includes, for example, a trench capacitor that is applied to, e.g., a dynamic RAM. The fuse element FS increases in resistance before programming and decreases in resistance after programming. The transistor N1 is a barrier transistor for protecting the latch circuit LT and its gate is always supplied with a high voltage VPP. The transistor N2 selects a fuse circuit in response to an address signal ADDi. The latch circuit LT holds data that is read out of the fuse element in read mode.

The second switch circuit 104 includes N-channel MOS transistors N20 and N21, a NAND circuit ND2, and an inverter circuit IV2 supplied with an output signal of the NAND circuit ND2. The input terminal of the NAND circuit ND2 is supplied with a verify signal VRFY generated in verify mode and the bank select signal BSS. A connection node between the transistors N20 and N21 is connected to the other end portion of each of the fuse circuits 102$_1$ and 102$_2$ to 102$_n$.

One end portion of the detection circuit 105 is connected to a pad 108 and the other end portion thereof is connected to the second switch circuit 104 through the second common wire 107. The detection circuit 105 detects a current flowing through the fuse element FS in verify mode.

When a defective memory cell is found in a bank (not shown) in a manufacturing process of a semiconductor device, the fuse element FS is programmed in order to replace the defective memory cell with a spare memory cell.

When the fuse element FS is programmed, the program signal PRGM is activated to a high level. Then, the voltage generation circuit 101 generates a high voltage VBP.

In the first switch circuit 103, the program signal PRGM and bank select signal BSS are set at a high level. The level of the output signal of the NAND circuit ND1 is therefore low. The transistor N11 that is supplied with the output signal through the inverter circuit IV1 turns on, and the transistor N10 that is supplied with the output signal turns off. Accordingly, the transistor P10 turns on, while the transistor P11 turns off.

In the second switch circuit 104, the verify signal VRFY is set at a low level and the bank select signal BSS is set at a high level. The level of the output signal of the NAND circuit ND2 is therefore high. The transistor N20 that is supplied with the output signal via the inverter circuit IV2 turns off, while the transistor N21 that is supplied with the output signal turns on.

When the fuse circuit 102$_1$ is selected in response to the address signal ADDi in the state as described above, the high voltage VBP generated from the voltage generation circuit 101 is supplied through a path including the first common wire 106, the transistor P10 of the first switch circuit 103, the fuse element FS, the transistors N1 and N2, the transistor N21 of the second switch circuit 104, and the ground, as indicated by a broken line A. Thus, a high voltage is applied to the fuse element FS, and the fuse element is programmed to low resistance.

Then, the state of the programmed fuse element is verified. In the verify operation, the program signal PRGM is set to a low level and the verify signal VRFY is set to a high level. The bank select signal BSS is also set to a high level.

When the program signal PRGM is at a low level, the level of the output signal of the NAND circuit ND1 of the first switch circuit 103 becomes high. The transistor N10 that is supplied with the output signal turns on, while the transistor N11 that is supplied with the output signal through the inverter circuit IV1 turns off. Accordingly, the transistor P11 turns on and the transistor P10 turns off.

The level of the output signal of the NAND circuit ND2 of the second switch circuit 104 becomes low in response to the verify signal VRFY and bank select signal BSS. Thus, the transistor N21 that is supplied with the output signal turns off, while the transistor N20 that is supplied with the output signal through the inverter circuit IV2 turns on.

In this state, a voltage for verification, which is lower than the program voltage, is applied to the pad 108. Thus, a current flows through a path including the detection circuit 105, the transistor N20 of the second switch circuit 104, the transistors N2 and N1, the fuse element FS, the transistor N10 of the second switch circuit 103, and the ground, as indicated by a thick broken line B. The detection circuit 105 detects a value of the current and accordingly the state of the fuse element FS is verified.

In order to program the fuse element FS with reliability, it is necessary to apply a high voltage of about 9V to the fuse element FS and pass a current of several milliamperes therethrough. To achieve this, the size of the transistors P10 and N21 composing the first and second switch circuits 103 and 104, respectively, e.g., the channel width thereof is set larger than that of another transistor. Further, the size of the transistors N1 and N2 in each fuse circuit needs to increase.

In verify mode, a current flows through the transistor N20 of the second switch circuit 104 and the transistor N10 of the first switch circuit 103. It is desirable that these transistors increase in size in order to improve the operating margin of verification.

The foregoing the general electric fuse circuit requires a plurality of large-sized transistors in order to program and verify the fuse element. The area of the transistors occupied in the chip becomes large and the size of the chip is difficult to reduce. Consequently, a semiconductor device that is capable of programming and verifying a fuse element with reliability without using any large-sized transistors, is desired.

BRIEF SUMMARY OF THE INVENTION

According to an aspect of the invention, there is provided a semiconductor device comprising: a fuse circuit having a first end portion and a second end portion, the fuse circuit being programmed electrically; a voltage generation circuit connected to the first end portion of the fuse circuit, the voltage generation circuit generating a first voltage in program mode to write data to the fuse circuit, a second voltage in verify mode to verify the data written to the fuse circuit, and a third voltage in read mode to read the data from the fuse circuit; and a first transistor connected to the second end portion of the fuse circuit, the first transistor turning on in the program mode.

DETAILED DESCRIPTION OF THE INVENTION

Embodiments of the present invention will now be described with reference to the accompanying drawings.

Figure 1:
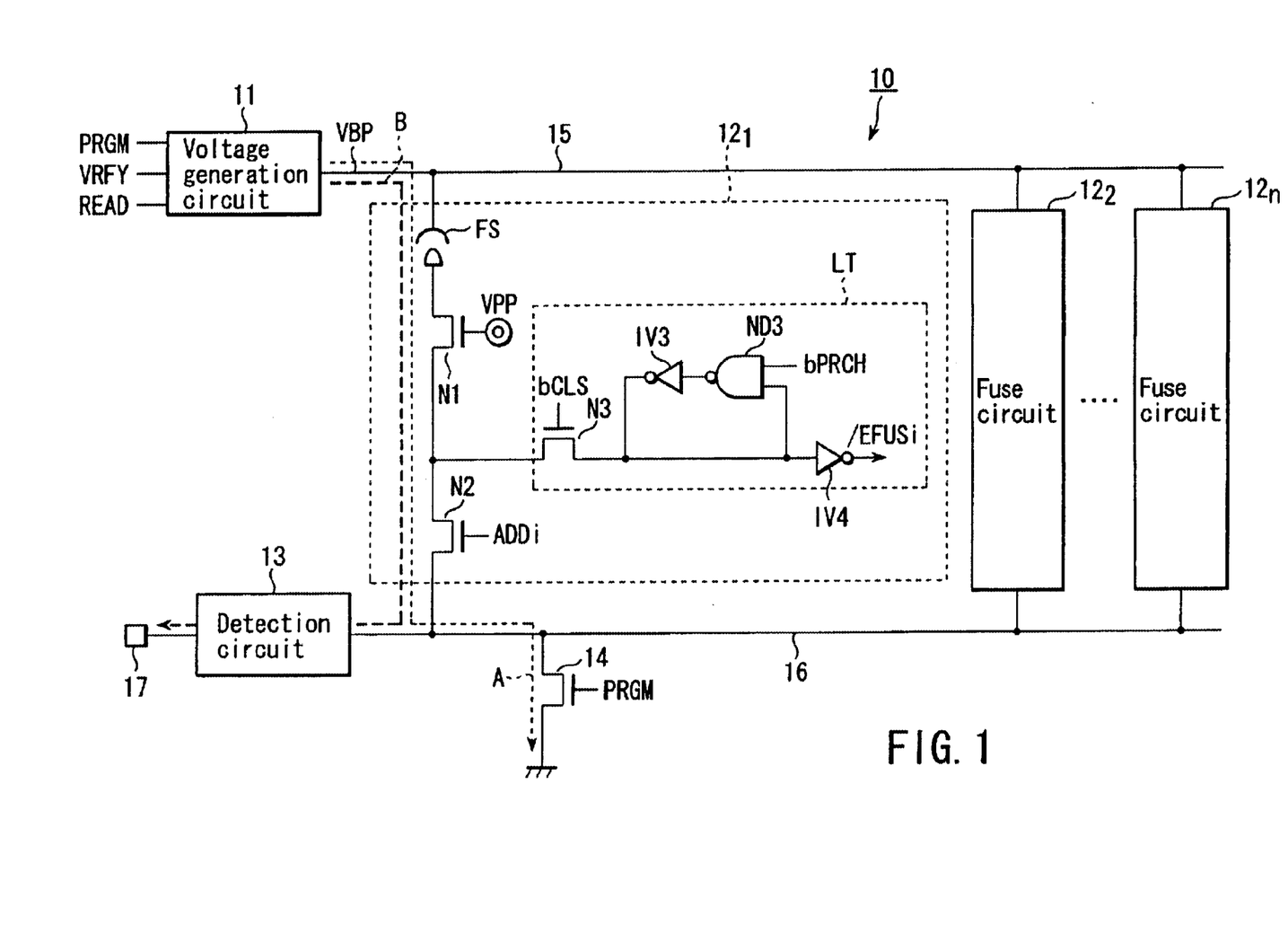
FIG. 1 is a block diagram showing a first embodiment of the present invention.

FIG. 1 shows only part of an electric fuse circuit according to a first embodiment of the present invention.

Referring to FIG. 1, an electric fuse circuit 10 comprises a voltage generation circuit 11, a plurality of fuse circuits $12_1$ and $12_2$ to $12_n$, a detection circuit 13, an N-channel MOS transistor 14, a first common wire 15, a second common wire 16, and a pad 17.

The voltage generation circuit 11 generates a high voltage VBP for programming, a voltage for verification, and a voltage for reading in response to a program signal PRGM, a verify signal VRFY, and a read signal READ, respectively. The programming is an operation for varying the conducting state of a fuse element. The verification is an operation for checking the conducting state of a fuse element. The reading is an operation for logically determining the state of a fuse element.

The first common wire 15 is connected to the output terminal of the voltage generation circuit 11. One end of each of the fuse circuits $12_1$ and $12_2$ to $12_n$ is connected to the first common wire 15, while the other end thereof is connected to the second common wire 16. The input terminal of the detection circuit 13 is connected to the second common wire 16. The detection circuit 13 detects a current flowing through a fuse element FS in verify mode. The output terminal of the detection circuit 13 is connected to the pad 17. The transistor 14 is connected between the second common wire 16 and the ground. The gate of the transistor 14 is supplied with the program signal PRGM.

The fuse circuits $12_2$ to $12_n$ each have the same arrangement as that of the fuse circuit $12_1$. The fuse circuit $12_1$ includes a fuse element FS, N-channel MOS transistors N1 and N2, and a latch circuit LT. The fuse element FS can be composed of a capacitive element (MOS capacitor) formed of a MOS transistor, a trench capacitor and a stacked capacitor each used as a memory cell of a dynamic RAM, or the like. The fuse element FS has a high resistance before programming and has a low resistance after programming.

The transistor N1 is a barrier transistor for protecting the latch circuit LT from a high voltage in program mode. The gate of the transistor N1 is always supplied with a voltage VPP. The voltage VPP has only to bring the transistor N1 into conduction and can be set at any potential. The transistor N2 selects a fuse circuit in response to an address signal ADDi. The address signal ADDi is predecoded in response to a bank select signal. In the present invention, therefore, only the fuse circuit is arranged in each back of a semiconductor memory device, as will be described later.

The latch circuit LT holds data that is read out of the fuse element FS in read mode. The latch circuit LT includes an N-channel MOS transistor N3, a NAND circuit ND3, and inverter circuits IV3 and IV4. More specifically, one end of a current path of the transistor N3 is connected to a connection node between the transistors N1 and N2. The gate of the transistor N3 is supplied with a close signal bCLS. A series circuit of the NAND circuit ND3 and inverter circuit IV3 is connected in parallel to the other end of the current path of the transistor N3. The input terminal of the NAND circuit ND3 is supplied with a precharge signal bPRCH. The input terminal of the inverter circuit IV4 is connected to the other terminal of the current path of the transistor N3. The output terminal of the inverter circuit IV4 outputs a signal /EFUSi. In response to the signal /EFUSi, the respective circuits of the semiconductor memory device are initialized.

Figure 2:
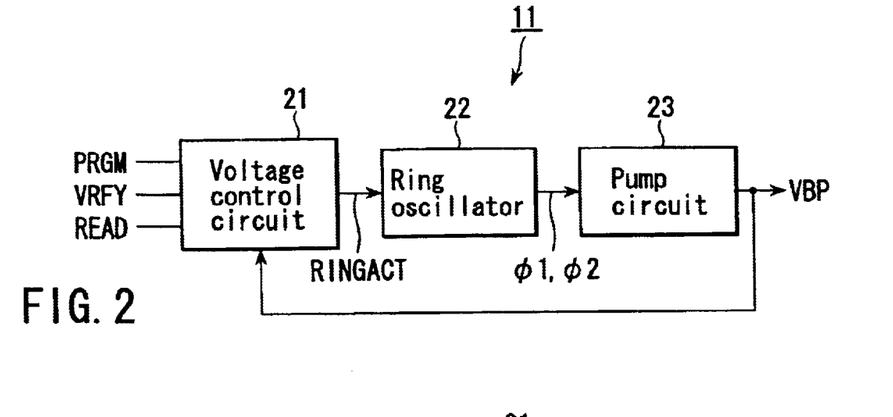
FIG. 2 is a block diagram of a voltage generation circuit shown in FIG. 1.

FIG. 2 illustrates the arrangement of the voltage generation circuit 11. The circuit 11 includes a voltage control circuit 21, a ring oscillator 22, and a pump circuit 23. The circuit 21 generates a control signal RINGACT for driving the ring oscillator 22 in response to a program signal PRGM, a verify signal VRFY, and a read signal READ. The control signal RINGACT is applied to the ring oscillator 22. The ring oscillator 22 generates signals φ1 and φ2 having a given period in accordance with the control signal RINGACT. These signals φ1 and φ2 are supplied to the pump circuit 23. In response to the signals φ1 and φ2, the pump circuit 23 steps up a power supply voltage and generates a high voltage for programming, a voltage for verification, and a voltage for reading. The output voltage VBP of the pump circuit 23 is applied to the voltage control circuit 21.

Figure 3:
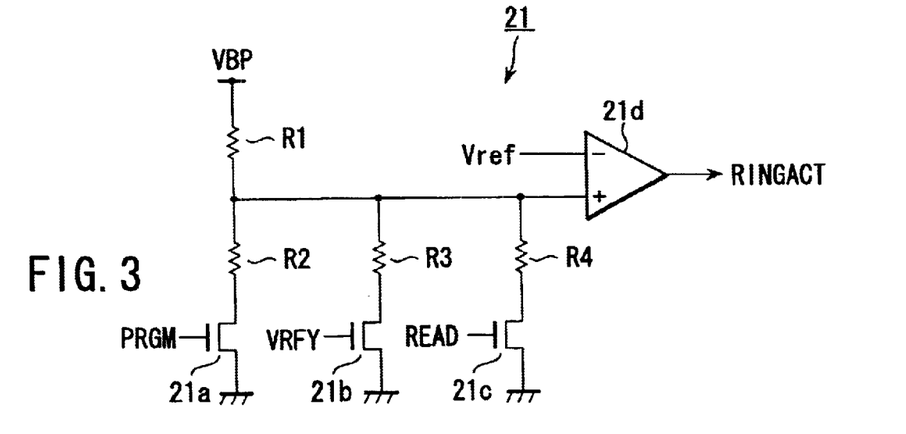
FIG. 3 is a circuit diagram illustrating one example of a control voltage generation circuit shown in FIG. 2.

FIG. 3 illustrates one example of the circuit arrangement of the voltage control circuit 21. The circuit 21 is composed chiefly of a resistance-type potential divider and a differential amplifier. One end of a resistor R1 is connected to a power supply VBP, while the other end thereof is connected to a noninverting input terminal of a differential amplifier 21d. A series circuit of a resistor R2 and an N-channel MOS transistor 21a, a series circuit of a resistor R3 and an N-channel MOS transistor 21b, and a series circuit of a resistor R4 and an N-channel MOS transistor 21c are connected between the noninverting input terminal and the ground.

The gate of the transistor 21a is supplied with the program signal PRGM, that of the transistor 21b is supplied with the verify signal VRFY, and that of the transistor 21c is supplied with the read signal READ. The inverting input terminal of the differential amplifier 21d is supplied with a reference voltage Vref and the output terminal thereof outputs the control signal RINGACT.

Figure 4:
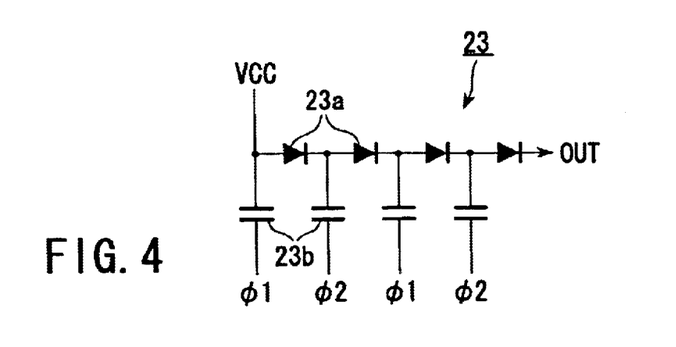
FIG. 4 is a circuit diagram illustrating one example of a pump circuit shown in FIG. 2.

FIG. 4 shows one example of the pump circuit 23 described above. The pump circuit 23 includes a plurality of diodes 21a connected in series and a plurality of capacitors 23b. One end of each of the capacitors 23b is connected to its corresponding connection node of adjacent two diodes 23a. The signals φ1 and φ2 are alternately supplied to the other ends of the capacitors 23b from the ring oscillator 22. A power supply voltage VCC is increased in response to the signals φ1 and φ2, and a necessary voltage is output from the output node OUT.

In the above-described arrangement, the program signal PRGM, verify signal VRFY, and read signal READ are activated to a high level in program, verify, and read modes, respectively. The differential amplifier 21d outputs a high-level control signal RINGACT when the potential of the noninverting input terminal is lower than the reference potential Vref. Thus, the ring oscillator 22 and pump circuit 23 operate in sequence to generate a necessary voltage.

The set potentials of voltage VBP output from the voltage generation circuit 11 are expressed as follows by, for example, the reference voltage Vref and the resistors R1 to R4.

The set potential of output voltage VBP in program mode is given as follows:

$$VBP(PRGM)=Vref\times[(R1+R2)/R2]$$

The set potential of output voltage VBP in verify mode is given as follows:

$$VBP(VRFY)=Vref\times[(R1+R3)/R3]$$

The set potential of output voltage VBP in read mode is given as follows:

$$VBP(READ)=Vref\times[(R1+R4)/R4]$$

The relationship among resistors R1, R2, R3 and F4 is given by, for example, the following equation:

$$R3=R4>R1>R2$$

Specifically, R1 is set at 150(Ω), R2 is set at 35(Ω), and R3 and R4 are each set at 160(Ω). However, the relationship in resistance can be varied with a relationship between the resistance and the reference voltage Vref.

Figure 5:
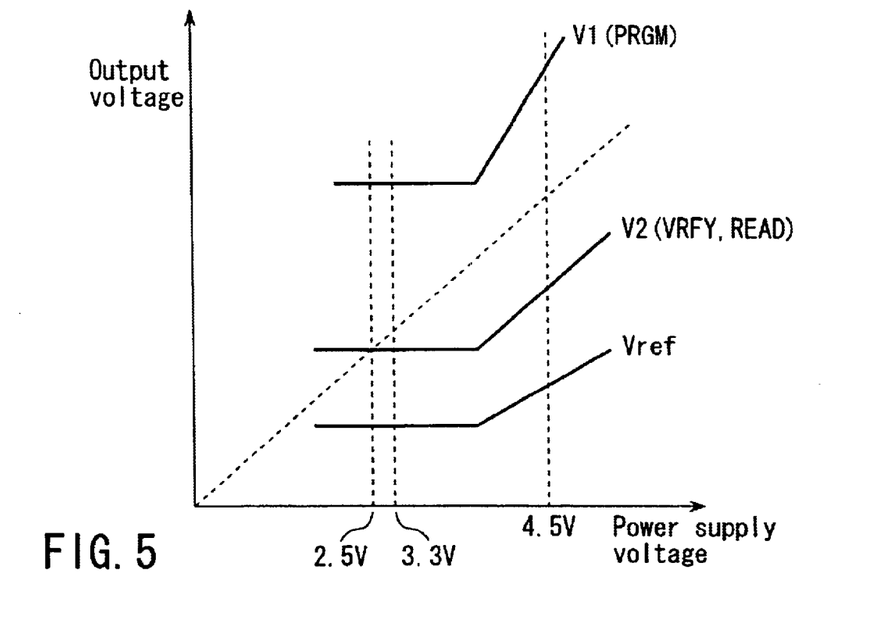
FIG. 5 is a graph showing an operation of the voltage generation circuit shown in FIG. 1.

FIG. 5 shows a relationship between a power supply voltage and an output voltage of the voltage generation circuit 11. As shown in FIG. 5, a power supply voltage set when a semiconductor device is tested and a power supply voltage set when a user uses the semiconductor device are different from each other. The former power supply voltage is set at, for example, 4.5V and the latter power supply voltage is set at, for example, 3.3V. In FIG. 5, 2.5V represents the lowest voltage that ensures an operation of the voltage generation circuit based on specifications.

In the example of FIG. 5, the output voltage V2 is set at about twice as high as the reference voltage Vref in verify and read modes and the output voltage V1 is set at about four times as high as the reference voltage Vref in program mode. However, the output voltages are not limited to these values but can be varied as needed.

Figure 6:
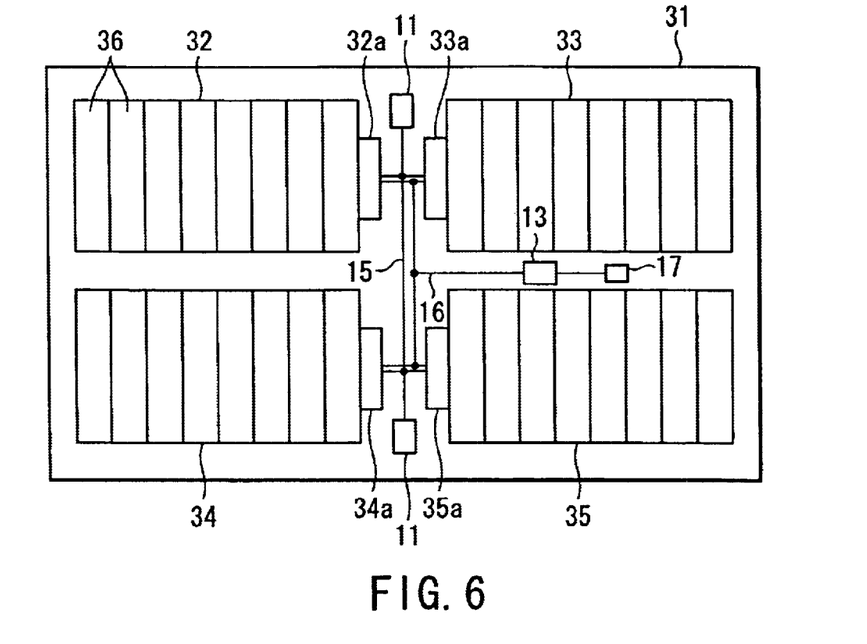
FIG. 6 is a diagram showing a structure of a semiconductor device to which the present invention is applied.

FIG. 6 schematically shows one example of a semiconductor memory device as a semiconductor device according to the present invention. For example, four banks 32 to 35 are provided on a chip 31. Each of these banks has a plurality of sub-arrays 36. The sub-arrays 36 include a plurality of memory cells (not shown). If the electric fuse circuit 10 having the above-described arrangement is employed, fuse blocks 32a to 35a are arranged so as to correspond to the banks 32 to 35, respectively. The fuse blocks 32a to 35a include only the fuse circuits $12_1$ and $12_2$ to $12_n$ of the electric fuse circuit 10, and the voltage generation circuit 11 and detection circuit 13 are arranged in arbitrary positions of the chip 31. The voltage generation circuit 11 and detection circuit 13 are connected to the fuse circuits $12_1$ and $12_2$ to $12_n$ of the fuse blocks 32a to 35a through the first and second common wires 15 and 16.

An operation of the electric fuse circuit 10 having the above arrangement will now be described with reference to FIGS. 1 and 7 to 9. In the electric fuse circuit 10, the program, verify, and read operation modes are set by, e.g., a command. The command has only to be used in conformity with the specifications of the semiconductor device.

(Program Operation)

Figure 7:
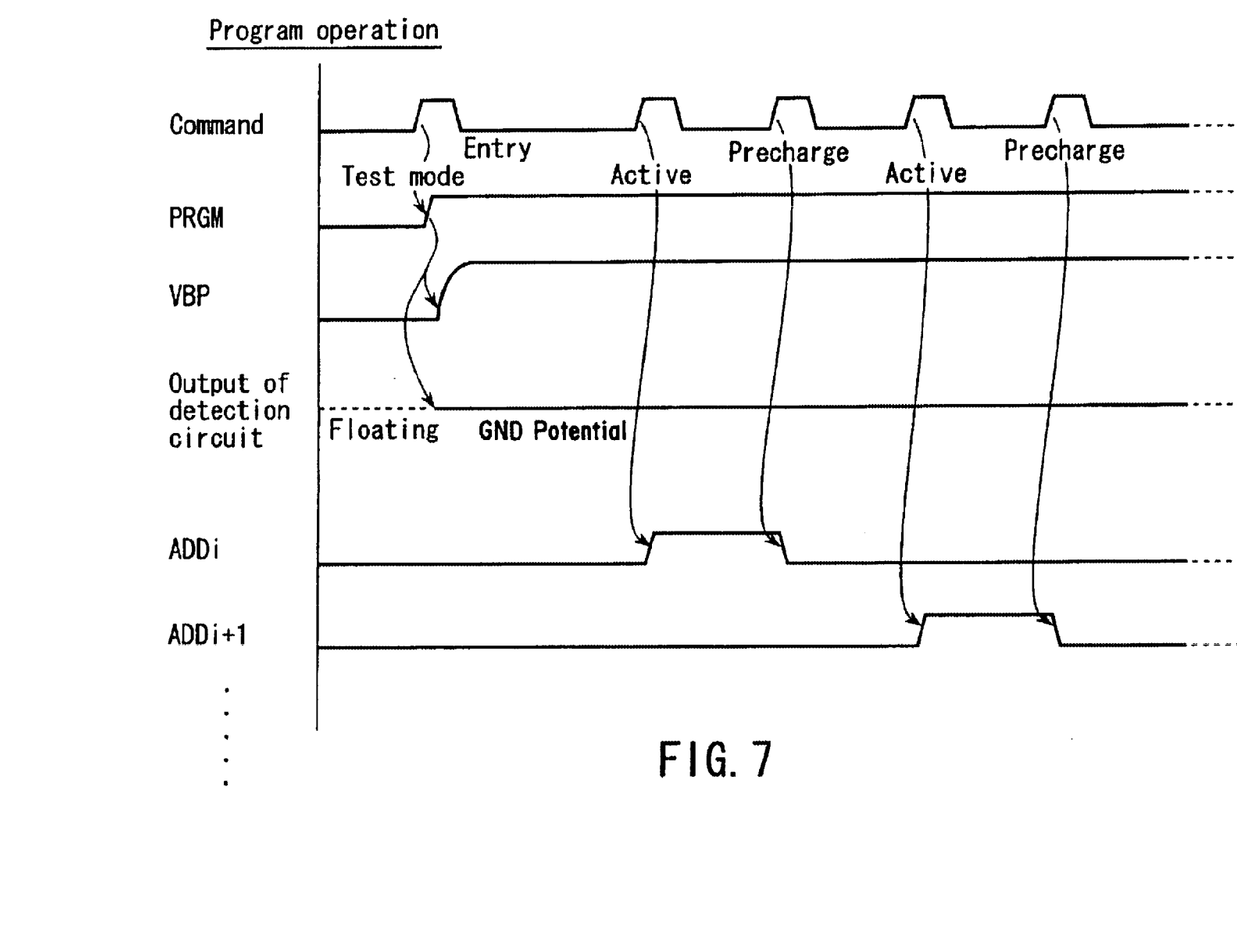
FIG. 7 is a timing chart showing a program operation of the first embodiment of FIG. 1.

FIG. 7 is a timing chart showing a program operation.

First, the electric fuse circuit 10 enters a program operation mode using a command. In this example, the command indicates a test mode. In conjunction with this, a program signal PRGM is activated to a high level. The voltage generation circuit 11 generates a high voltage VBP for programming in response to the program signal PRGM. At this time, the transistor 14 turns on in response to the program signal PRGM, and the second common wire 16 is set at the ground potential.

Then, an address signal ADDi for selecting an arbitrary fuse circuit is activated to a high level in response to, e.g., an active command and supplied to the gate of the transistor N2. If the transistor N2 of the fuse circuit $12_1$ shown in FIG. 1 is selected, it turns on. Thus, a high voltage VBP output from the voltage generation circuit 11 is applied to a fuse element FS corresponding to the transistor N2. The fuse element FS is therefore programmed in a low-resistance state. Consequently, a current flows through a path including the voltage generation circuit 11, fuse element FS, and transistors N1, N2 and 14, as indicated by the broken line A in FIG. 1.

After that, the selected address signal ADDi is reset in response to, e.g., a precharge command.

When the need arises, an arbitrary fuse element is selected using an active command and a precharge command and programmed by the same operation as described above.

(Verify Operation)

Figure 8:
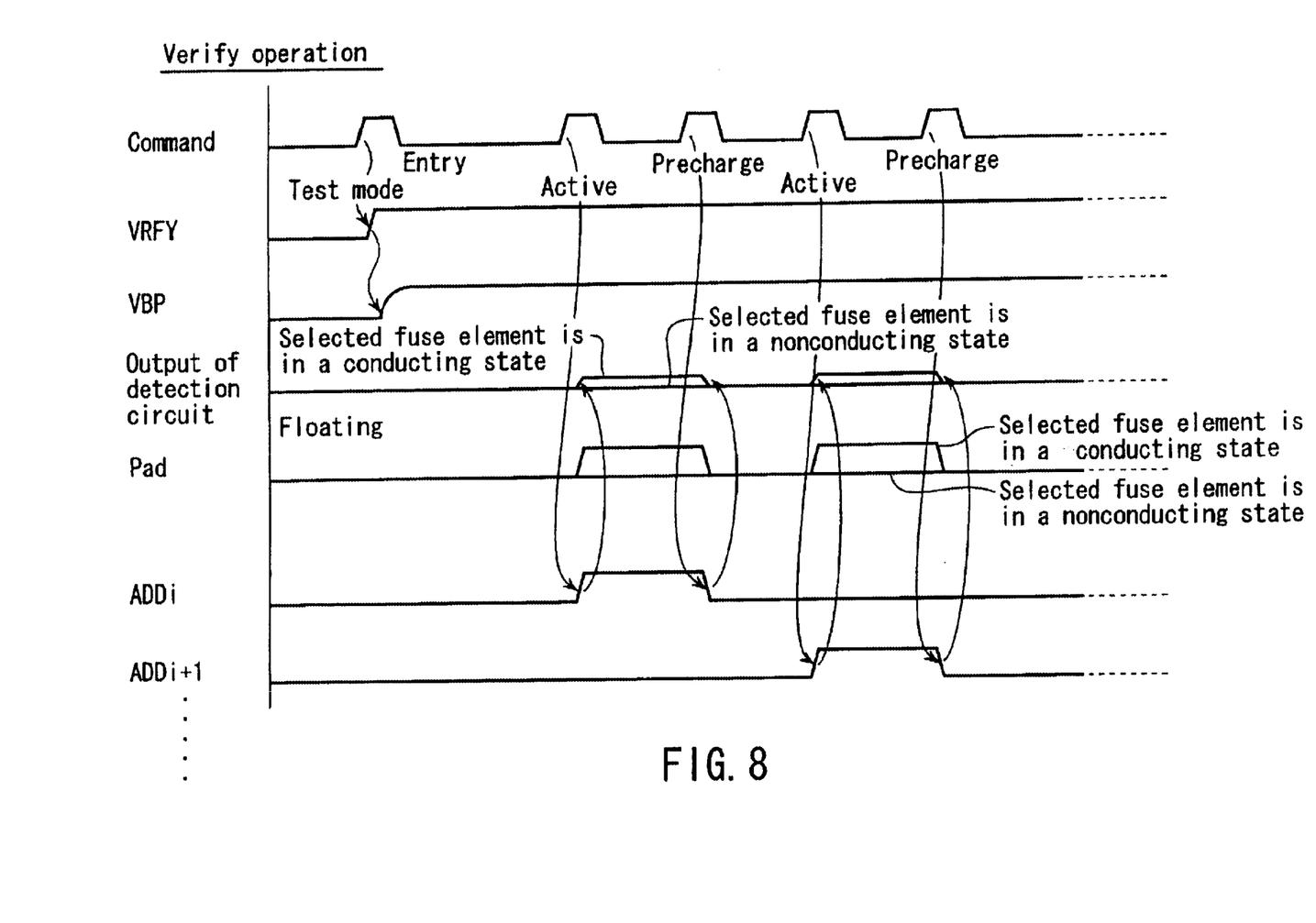
FIG. 8 is a timing chart showing a verify operation of the first embodiment of FIG. 1.

FIG. 8 is a timing chart showing a verify operation.

First, the electric fuse circuit 10 enters a verify operation mode using a command indicating, for example, a test mode. In conjunction with this, a verify signal VRFY is activated to a high level. The voltage generation circuit 11 generates a voltage VBP for verification in response to the verify signal VRFY.

At this time, the program signal PRGM is set at a low level. The transistor 14 turns off and the second common wire 16 is connected to the pad 17 through the detection circuit 13. The pad 17 is supplied with, e.g., the ground potential. The detection circuit 13 detects a current flowing into the pad 17 and monitors the state of the fuse element FS.

Then, an address signal ADDi for selecting an arbitrary fuse circuit is activated to a high level in response to, e.g., an active command and supplied to the gate of the transistor N2. When the transistor N2 of the fuse circuit $12_1$ shown in FIG. 1 is selected, it turns on. Thus, a voltage for verification output from the voltage generation circuit 11 is applied to a fuse element FS corresponding to the transistor N2. Consequently, when a programmed fuse element FS is selected, a current flows through a path including the voltage generation circuit 11, fuse element FS, transistors N1, N2 and 14, detection circuit 13, and pad 17 as indicated by the thick broken line B in FIG. 1. The detection circuit 13 monitors the state of the fuse element FS.

When a non-programmed fuse element is selected, no current flows through the detection circuit 13. When a fuse element that is not programmed sufficiently is selected, a small amount of current flows through the detecting circuit 13. The state of a fuse element can thus be detected in accordance with the amount of current flowing through the detection circuit 13.

After that, the selected address signal ADDi is reset in response to, e.g., a precharge command.

When the need arises, an arbitrary fuse element is selected using an active command and a precharge command and verified by the same operation as described above.

(Read Operation)

Figure 9:
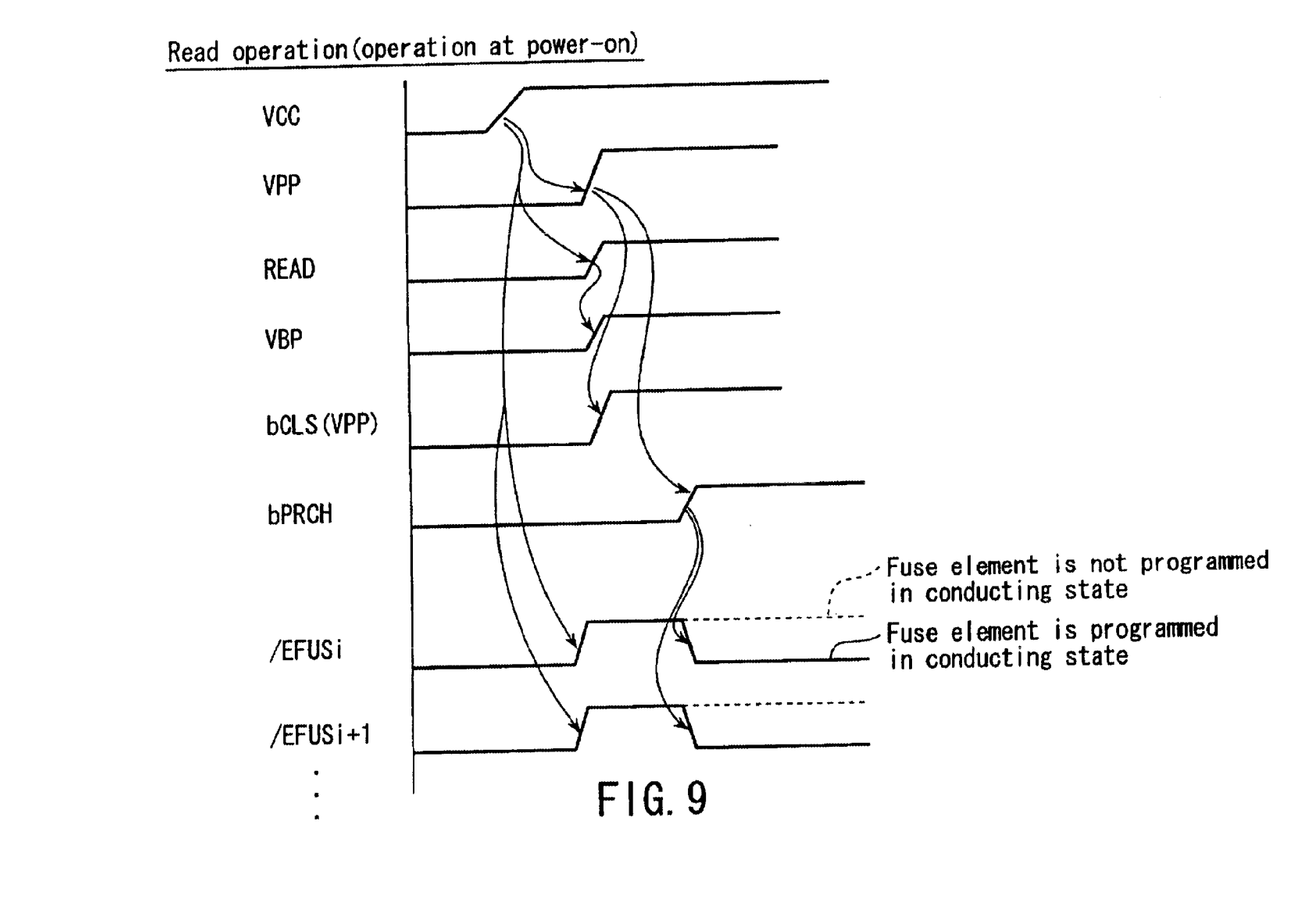
FIG. 9 is a timing chart showing a read operation of the first embodiment of FIG. 1.

FIG. 9 is a timing chart showing a read operation.

A read operation is generally performed when power turns on. In the read operation, the state of a fuse element is determined before the semiconductor device is accessed and held in the latch circuit LT. Various circuits in the semiconductor device are initialized in response to the output signal of the latch circuit LT.

When an appropriate period of time elapses after a power supply voltage VCC is applied, a circuit (not shown) generates a voltage VPP. The voltage VPP is applied to the gate of the transistor N1 that operates as a barrier transistor. As the voltage Vpp rises, a signal bCLS rises and the transistor N3 shown in FIG. 1 turns on. Therefore, the latch circuit LT and fuse element FS are connected to each other.

Similarly, when an appropriate period of time elapses, a read signal READ is activated to a high level. In response to the read signal READ, the voltage generation circuit 11 operates to generate a voltage VBP for reading.

After the voltages VPP and VBP reach a set potential, a precharge signal bPRCH goes the high level. The state of the fuse element FS is supplied to the latch circuit LT through the transistors N1 and N3 and held by the NAND circuit ND3 and inverter circuit IV3.

When the fuse element FS is programmed and rendered in a low-resistance state, the level of output signal /EFUSi of the latch circuit LT becomes low. When the fuse element FS is not programmed and rendered in a high-resistance or open state, the level of the output signal /EFUSi remains high.

According to the first embodiment described above, the voltage generation circuit 11 generates a necessary voltage in program, verify and read modes and supplies it to a selected one of the fuse circuits $12_1$ and $12_2$ to $12_n$. It is thus unnecessary to interpose any switch circuit between the voltage generation circuit and the fuse circuits $12_1$ and $12_2$ to $12_n$ and between the $12_1$ $12_2$ to $12_n$ and the detection circuit 13, unlike in the prior art. Since, therefore, the number of large-sized transistors can be reduced, the area of the electric fuse circuit occupied in the chip can be decreased and so can be the area of the chip.

In the general electric fuse circuit, the directions of current flowing through the fuse element FS in program and verify modes are opposite to each other. In other words, if a current flows in a forward direction in program mode, it flows in a backward direction in verify mode. Such a fuse element generally varies in resistance from the forward direction of current to the backward direction thereof, and the resistance in the backward direction is higher than that in the forward direction. It is thus difficult to verify a fuse element correctly.

In contrast, according to the first embodiment of the present invention, a current is supplied to the fuse element FS from the voltage generation circuit 11 in the same direction in program, verify and read modes. The detection circuit 13 can correctly detect the current flowing through the programmed fuse element. Consequently, the state of the fuse element can be verified correctly.

(Second Embodiment)

Figure 10:
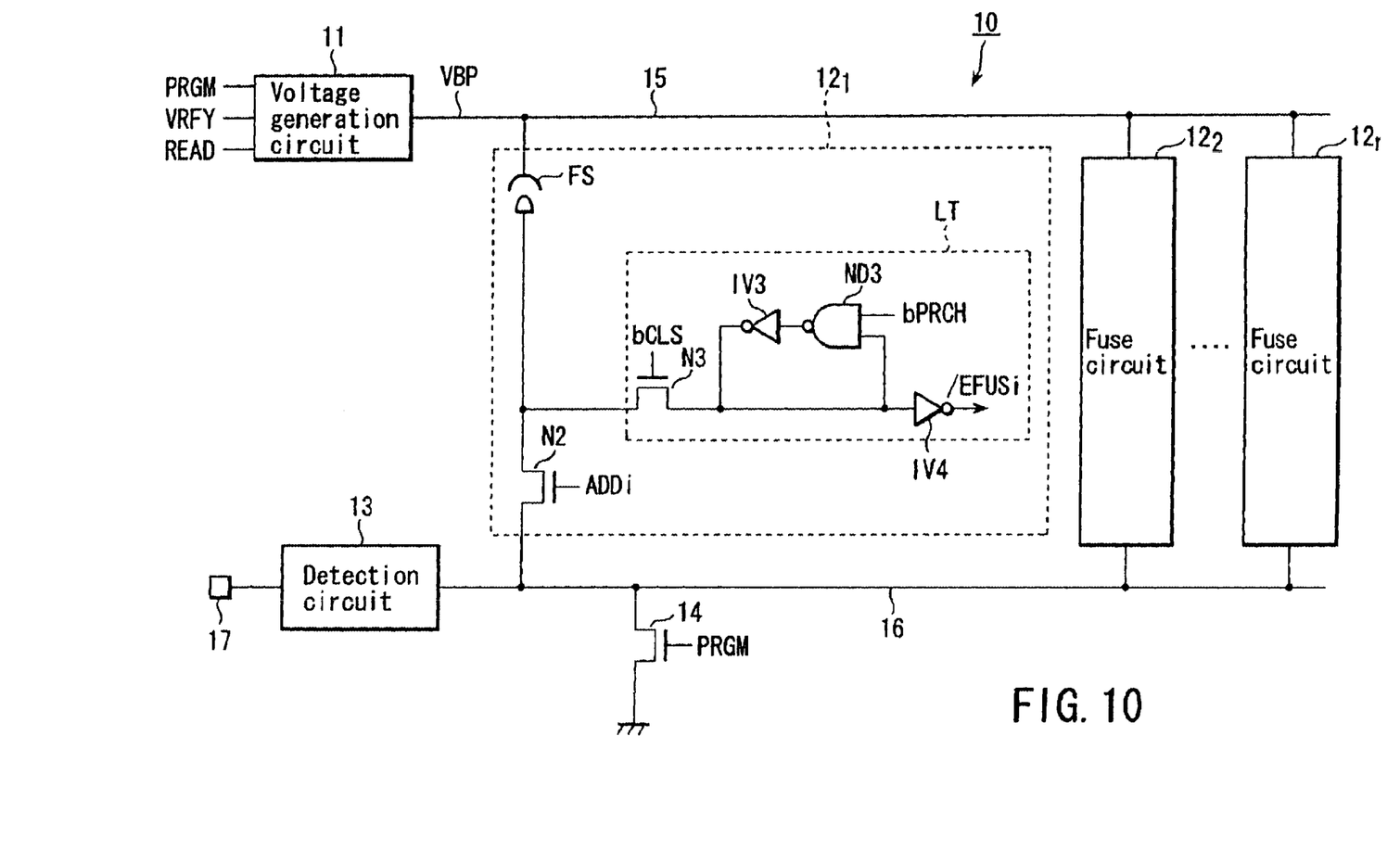
FIG. 10 is a block diagram showing a second embodiment of the present invention.

FIG. 10 illustrates a second embodiment of the present invention. In FIG. 10, the same elements as those of the first embodiment are denoted by the same reference numerals.

A barrier transistor for protecting a latch circuit, which is shown in FIG. 1, is omitted from the second embodiment illustrated in FIG. 10. The fuse element FS and latch circuit LT are directly connected to each other, as is the fuse element FS and the transistor N2.

Since the program, verify and read operations of the second embodiment are the same as those of the first embodiment, their descriptions are omitted.

With the foregoing circuit arrangement of the second embodiment, the number of elements can be reduced as the transistor N2 is omitted. When a current flows through the fuse element FS in program, verify and read operations, there is no voltage drop due to the barrier transistor. For this reason, the size of the transistor N2 for selecting a fuse element FS can be decreased and so can be the size of the latch circuit. Moreover, the size of a chip can be decreased.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

a fuse circuit having a first end portion and a second end portion, the fuse circuit being programmed electrically;

a voltage generation circuit connected to the first end portion of the fuse circuit, the voltage generation circuit generating a first voltage in program mode to write data to the fuse circuit, a second voltage in verify mode to verify the data written to the fuse circuit, and a third voltage in read mode to read the data from the fuse circuit; and a first transistor connected to the second end portion of the fuse circuit, the first transistor turning on in the program mode.

2. The device according to claim 1, wherein the fuse circuit comprises:

a fuse element one end of which is connected to the first end portion;

a second transistor connected between the fuse element and the second end portion, the second transistor selecting the fuse element in the program mode; and a latch circuit connected between the fuse element and the second transistor, the latch circuit holding data read out of the fuse element in the read mode.

3. The device according to claim 1, further comprising a detection circuit connected to the second end portion of the fuse circuit, the detection circuit detecting a current flowing through the fuse circuit in the verify mode.

4. The device according to claim 1, further comprising a third transistor connected between the fuse element and the latch circuit.

5. The device according to claim 4, further comprising a fourth transistor connected between the third transistor and the fuse element, the fourth transistor protecting the latch circuit in the program mode.

6. A semiconductor device comprising:

a fuse element that is electrically programmable;

a first transistor having a current path one end of which is connected to one end of the fuse element, the first transistor selecting a fuse element in response an address signal;

a voltage generation circuit whose output terminal is connected to another end of the fuse element, the voltage generation circuit generating a first voltage in program mode to write data to the fuse element, a second voltage in verify mode to verify the data written to the fuse element, and a third voltage in read mode to read the data from the fuse element; and a second transistor having a current path one end of which is connected to another end of the current path of the first transistor, the second transistor turning on in the program mode.

7. The device according to claim 6, further comprising:

a latch circuit connected between the fuse element and the first transistor, the latch circuit holding data read out of the fuse element in the read mode; and a third transistor connected between the fuse element and the latch circuit.

8. The device according to claim 6, further comprising:

a detection circuit connected between the first transistor and the second transistor, the detection circuit detecting a current flowing through the fuse element and the first transistor in the verify mode.

9. The device according to claim 7, further comprising:

a fourth transistor connected between the third transistor and the fuse element, the fourth transistor protecting the latch circuit in the program mode.

10. A semiconductor device comprising:

a plurality of fuse elements that are electrically programmable;

a first common wire connected to one end of each of the fuse elements;

a voltage generation circuit connected to the first common wire, the voltage generation circuit generating a first voltage in program mode to write data to the fuse elements, a second voltage in verify mode to verify the data written to the fuse elements, and a third voltage in read mode to read the data from the fuse elements;

a plurality of first transistors connected to other ends of the fuse elements, respectively, each of the first transistors selecting a fuse element in response to an address signal;

a second common wire connected in common to the first transistors; and a second transistor connected between the second common wire and a ground, the second transistor turning on in the program mode.

11. The device according to claim 10, further comprising:

a latch circuit connected between each of the fuse elements and each of the first transistors, the latch circuit holding data read out of each of the fuse elements in the read mode; and a third transistor connected between each of the fuse elements and the latch circuit.

12. The device according to claim 10, further comprising:

a detection circuit connected to the second common wire, the detection circuit detecting a current flowing through one of the fuse element selected in the verify mode and the first transistor.

13. The device according to claim 11, further comprising:

a fourth transistor connected between the third transistor and the fuse element, the fourth transistor protecting the latch circuit in the program mode.

14. A semiconductor device comprising:

a memory cell array having a plurality of banks;

a plurality of fuse circuits that are arranged in the banks, respectively and electrically programmable;

a first common wire connected to one end of each of the fuse circuits;

a second common wire connected to another end of each of the fuse circuits;

a voltage generation circuit connected to the first common wire, the voltage generation circuit generating a first voltage in program mode to write data to the fuse circuits, a second voltage in verify mode to verify the data written to the fuse circuits, and a third voltage in read mode to read the data from the fuse circuits; and a first transistor connected between the second common wire and a ground, the first transistor turning on in the program mode.

15. The device according to claim 14, wherein the plurality of fuse circuits each comprises:
a fuse element one end of which is connected to the first common wire;
a second transistor connected between the fuse element and the second common wire, the second transistor selecting the fuse element in the program mode; and
a latch circuit connected between the fuse element and the second transistor, the latch circuit holding data read out of the fuse element in the read mode.

16. The device according to claim 14, further comprising:
a latch circuit connected between the fuse element and the first transistor, the latch circuit holding data read out of the fuse element in the read mode; and
a third transistor connected between the fuse element and the latch circuit.

17. The device according to claim 14, further comprising:
a detection circuit connected to the second common wire, the detection circuit detecting a current flowing through the fuse circuits in the verify mode.

18. The device according to claim 16, further comprising:
a fourth transistor connected between the third transistor and the fuse element, the fourth transistor protecting the latch circuit in the program mode.

* * * * *